(12) United States Patent
Takahashi (10) Patent No.: US 9,871,185 B2
(45) Date of Patent: Jan. 16, 2018

(54) DRIVE DEVICE USING POLYMER ACTUATOR

(71) Applicant: ALPS ELECTRIC CO., LTD., Ota-ku, Tokyo (JP)

(72) Inventor: Isao Takahashi, Tokyo (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 786 days.

(21) Appl. No.: 14/486,219

(22) Filed: Sep. 15, 2014

(65) Prior Publication Data

US 2015/0001995 A1    Jan. 1, 2015

Related U.S. Application Data

(63) Continuation of application No. PCT/JP2013/054937, filed on Feb. 26, 2013.

(30) Foreign Application Priority Data

Mar. 15, 2012 (JP) ................. 2012-059265

(51) Int. Cl.
*H01L 41/09* (2006.01)
*G09B 21/00* (2006.01)
*H01L 41/193* (2006.01)

(52) U.S. Cl.
CPC .......... *H01L 41/094* (2013.01); *G09B 21/004* (2013.01); *H01L 41/193* (2013.01)

(58) Field of Classification Search
CPC .... H01L 41/094; H01L 41/193; G09B 21/004
USPC .................. 310/311, 328, 366, 800
See application file for complete search history.

(56) References Cited

U.S. PATENT DOCUMENTS

2008/0208232 A1* 8/2008 Yamada ......... A61B 17/320068
606/169
2009/0097140 A1* 4/2009 Choi ........................ G02B 7/08
359/824

FOREIGN PATENT DOCUMENTS

JP    2005-259488    9/2005
JP    2010-41860    2/2010

* cited by examiner

*Primary Examiner* — Thomas Dougherty
(74) *Attorney, Agent, or Firm* — Hunton & Williams LLP (57) ABSTRACT

A drive device includes a driven body provided on an opening of a case, and a polymer actuator which is bent and deformed in a height direction and movably supports the driven body in the height direction. A first conductive portion is provided on the case side, a second conductive portion is provided on the driven body side, and the first conductive portion and the second conductive portion configure a plurality of contact portions. When the driven body is raised by the polymer actuator, the first conductive portion and the second conductive portion come into contact with each other by the plurality of contact portions, and thus, the raised state of the driven body is detected.

10 Claims, 5 Drawing Sheets

DRIVE DEVICE USING POLYMER ACTUATOR

CLAIM OF PRIORITY

This application is a Continuation of International Application No. PCT/JP2013/054937 filed on Feb. 26, 2013, which claims benefit of Japanese Patent Application No. 2012-059265 filed on Mar. 15, 2012. The entire contents of each application noted above are hereby incorporated by reference.

BACKGROUND OF THE INVENTION

1. Field of the Invention

The present invention relates to a drive device using a polymer actuator capable of moving a driven body by the polymer actuator.

2. Description of the Related Art

Japanese Unexamined Patent Application Publication No. 61-67882 discloses a Braille device in which a switch mechanism for confirming an operation of a push rod is provided.

In Japanese Unexamined Patent Application Publication No. 61-67882, the push rod is moved up and down by a solenoid, and when the solenoid is out of order and the push rod cannot be appropriately pushed up, the switch is not turned on, and thus, it is possible to inform abnormality.

Then, the driven body is shortened and weight thereof is reduced from needs such as a decrease in the thickness of the device and a reduction in power consumption, and a polymer actuator is considered as an actuator for driving the driven body in a predetermined direction.

The polymer actuator is configured to include electrode layers on both surfaces of an electrolyte layer and is bent and deformed in a height direction when a voltage is applied to a portion between electrode layers, and thus, a decrease in the thickness of the device and a reduction in power consumption can be promoted.

However, when the driven body is driven to be raised by the polymer actuator bent and deformed in a predetermined direction, a force in an inclined direction is generated between the polymer actuator and the driven body in order to bend and deform the polymer actuator, and the driven body may be driven in a state of being inclined. In this case, the driven body is caught between openings provided on a case, the driven body cannot protrude straight from the opening and with a predetermined dimension, and particularly, this easily occurs as the size of the driven body is decreased and the weight thereof is decreased.

Such an abnormal movement state of the driven body cannot be securely detected by the switch mechanism of Japanese Unexamined Patent Application Publication No. 61-67882.

SUMMARY OF THE INVENTION

The present invention provides a drive device capable of securely detecting that a driven body is driven normally.

According to the present invention, there is provided a drive device using a polymer actuator including a driven body provided in an opening of a first member, and a polymer actuator configured to be bent and deformed and to support the driven body to move the driven body in a predetermined drive direction. A first conductive portion is provided on the first member side, a second conductive portion is provided on the driven body side, a plurality of contact portions are configured of the first conducive portion and the second conductive portion, the first conducive portion and the second conductive portion come into contact with each other on the plurality of contact portions when the driven body is moved by the polymer actuator, and a movement state of the driven body can be detected. According to the present invention, the movement state of the driven body is not detected when the driven body is moved in the state where the driven body is inclined or the like and the plurality of contact portions are not in contact. In this way, since the movement state of the driven body is detected for the first time after the plurality of contact portions are in contact, it is possible to securely detect that the driven body is moved normally.

In addition, in the present invention, at least one of the first conductive portion and the second conductive portion may be divided into a plurality of conductive patterns, and may configure the plurality of contact portions.

Moreover, in the present invention, a second member may be provided in an inner portion of the first member, a third conductive portion may be provided on the second member side, a fourth conductive portion may be provided on the driven body side, a plurality of contact portions may be configured of the third conductive portion and the fourth conductive portion, the third conductive portion and the fourth conductive portion may come into contact with each other on the plurality of contact portions when the driven body is returned, and the return state of the driven body may be detected. Accordingly, it is possible to securely detect that the driven body is returned normally.

In addition, in the present invention, at least one of the third conductive portion and the fourth conductive portion may be divided into a plurality of conductive patterns, and may configure the plurality of contact portions.

Moreover, in the present invention, a protrusion, which opposes a detection surface positioned on the side of the opening in the drive direction, may be provided on the driven body, the first conductive portion may be provided on the detection surface, and the second conductive portion may be provided on a surface opposing the detection surface of the protrusion. Therefore, when the driven body is moved, the contact states of the plurality of contact portions can be detected by a simple structure, and the movement state can be securely detected.

In addition, in the present invention, a second member opposing the protrusion may be provided on a side opposite to the detection surface in the drive direction of the protrusion, a third conductive portion may be provided on a surface opposing the protrusion of the second member, a fourth conductive portion may be provided on a surface opposing the second member of the protrusion, the third conductive portion and the fourth conductive portion may come into contact with each other on a plurality of contact portions when the driven body is returned, and a return state of the driven body may be detected. Accordingly, when the driven body is returned, the contact state of the plurality of contact portions can be detected by a simple structure, and the return state can be securely detected.

Moreover, in the present embodiment, the entirety or a portion of the protrusion of the driven body may be formed of a conductive resin. Accordingly, the driven body can be formed by a simple configuration.

In the present invention, at least a portion of the conductive portion provided to come into contact with or be separated from the contact portions by a movement in a predetermined drive direction of the driven body may be formed of an elastic conductive resin material. Accordingly, the conductive portions can safely come into electric contact with each other.

Moreover, in the present invention, a plurality of projections may be formed on at least one surface of the conductive portion provided to come into contact with or be separated from the contact portions by a movement in a predetermined drive direction of the driven body. Accordingly, the conductive portions can safely come into electric contact with each other.

Moreover, in the present invention, a deformation detection portion configured to detect bending and deformation of the polymer actuator may be provided. Accordingly, it is possible to detect whether or not the polymer actuator is driven normally.

DESCRIPTION OF THE PREFERRED EMBODIMENTS

Figure 1A:
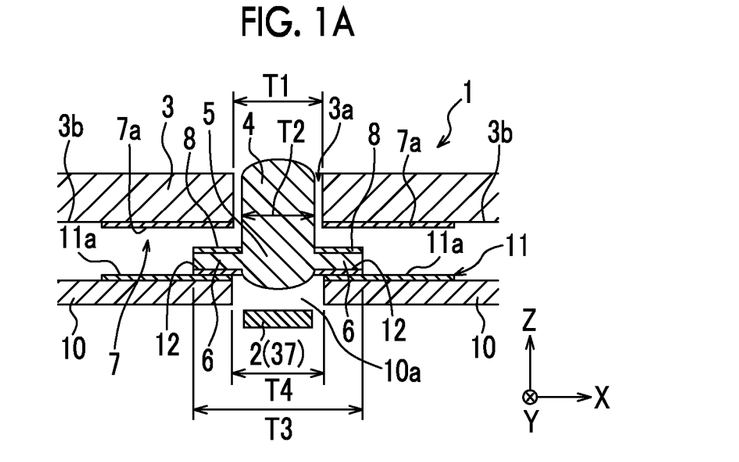
FIG. 1A shows a lowering state of a driven body, and, particularly, is a vertical partial cross-sectional view of an input device according to the present embodiment when taken along line A-A of FIG. 1C and viewed from an arrow direction.
Figure 1B:
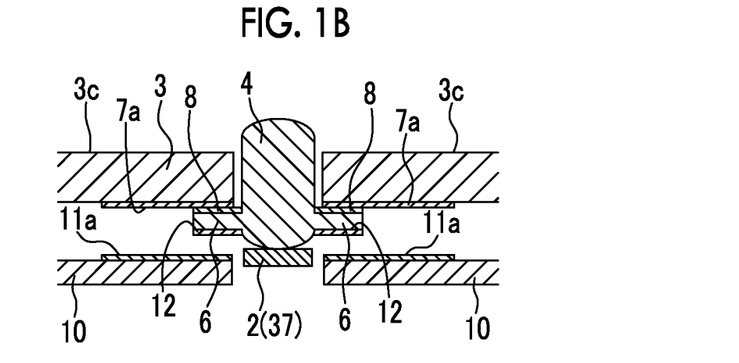
FIG. 1B is a vertical partial cross-sectional view of the input device according to the present embodiment showing a raised state of the driven body.
Figure 1C:
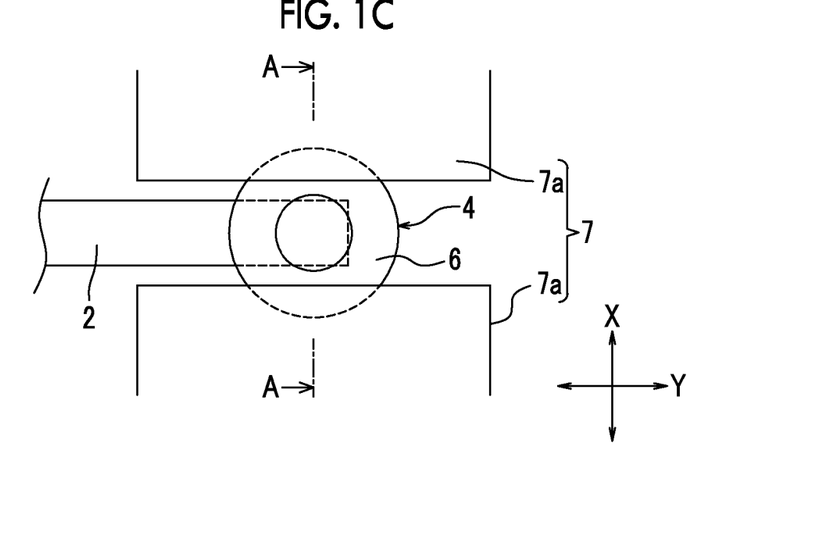
FIG. 1C is a partial plan view (a plan view obtained by seeing through a case) of the input device according to the present embodiment.
Figure 2:
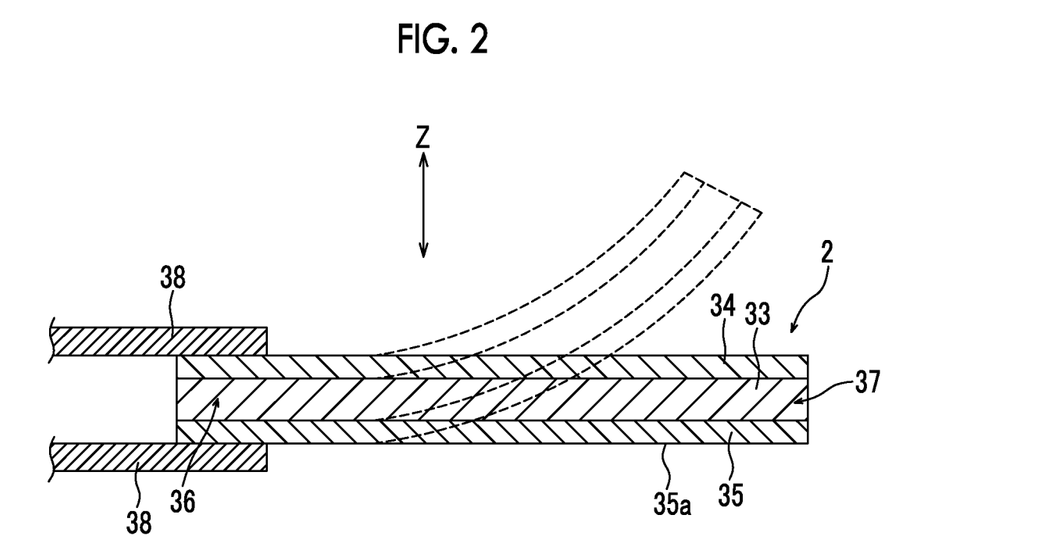
FIG. 2 is an explanatory view (vertical partial cross-sectional view) showing a structure and an operation of a polymer actuator according to the present embodiment.
Figure 3A:
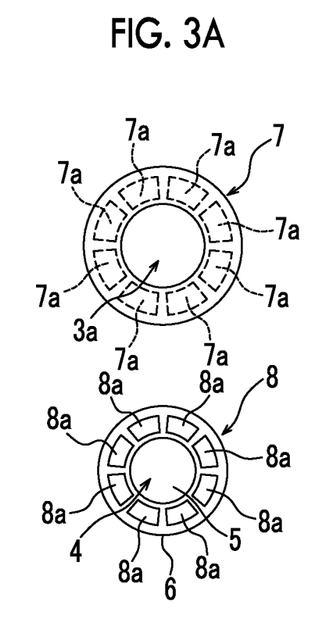
FIG. 3A is a plan view showing a conductive pattern of a first conductive portion and a conductive pattern of a second conductive portion.
Figure 3B:
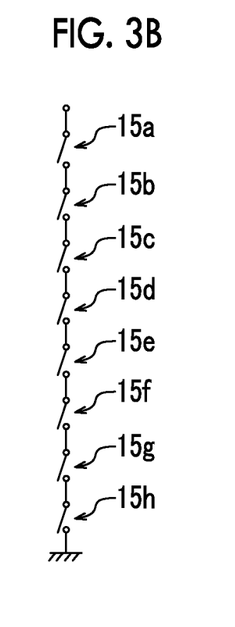
FIG. 3B is a circuit configuration diagram for detecting a raised state of the driven body.
Figure 3C:
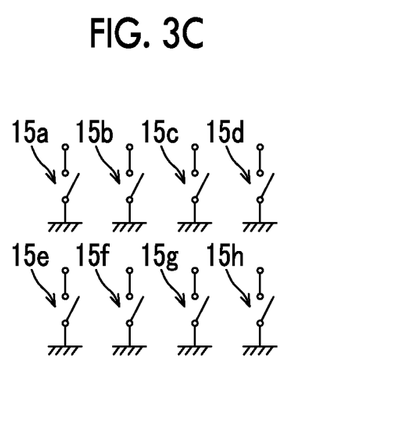
FIG. 3C is a circuit configuration diagram different from FIG. 3B.

An input device shown in FIGS. 1A to 1C is an input device which drives a driven body in a predetermined direction (vertical direction or height direction). FIG. 1A shows a lowering state (return state) of a driven body, and, particularly, is a vertical partial cross-sectional view of an input device according to the present embodiment when taken along line A-A of FIG. 1C and viewed from an arrow direction, FIG. 1B is a vertical partial cross-sectional view of the input device according to the present embodiment showing a raised state (movement state) of the driven body, and FIG. 1C is a partial plan view (a plan view obtained by seeing through a case) of the input device according to the present embodiment. In addition, FIG. 2 is an explanatory view (vertical partial cross-sectional view) showing a structure and an operation of a polymer actuator according to the present embodiment. FIG. 3A is a plan view showing a conductive pattern of a first conductive portion and a conductive pattern of a second conductive portion, FIG. 3B is a circuit configuration diagram for detecting a raised state of the driven body, and FIG. 3C is a circuit configuration diagram different from FIG. 3B.

The drive device 1 shown in FIGS. 1A to 1C is configured to include a case (first member) 3 having an opening 3a on an upper surface (surface), a driven body 4 disposed in the opening 3a, and a polymer actuator 2.

For example, the polymer actuator 2 has a structure shown in FIG. 2. As shown in FIG. 2, the polymer actuator 2 according to the present embodiment is configured to include an electrolyte layer 33 and an upper electrode layer 34 and a lower electrode layer 35 which are formed on both surfaces in a thickness direction (Z) of the electrolyte layer 33.

For example, the polymer actuator 2 according to the embodiment of the present invention is configured to include the electrolyte layer 33 having an ion liquid and a base polymer, a conductive filler such as a carbon nano-tube, and the upper electrode layer 34 and the lower electrode layer 35 having an ion liquid and a base polymer. The upper electrode layer 34 is formed on the shown upper surface side of the electrolyte layer 33, and the lower electrode layer 35 is formed on the shown lower surface side of the electrolyte layer 33.

The base polymer may include polyvinylidene fluoride, polymethyl methacrylate (PMMA), or the like. Particularly, preferably, a polyvinylidene fluoride based polymer is used among these.

The ion liquid may include ethyl-methyl-imidazolium-tetrafluoroborate (EMIBF4), ethyl-methyl-imidazolium bis (trifluoromethane sulfonyl) imide (EMITFSI), or the like.

A base end 36 of the polymer actuator 2 is a fixing end, and the base end 36 of the polymer actuator 2 is supported to be fixed by fixing support portions 38. For example, as shown in FIG. 2, the polymer actuator 2 is supported in a cantilever manner. In addition, if a drive voltage is applied to a portion between the electrode layers 34 and 35 respectively having both surfaces, as shown in FIG. 2, a swelling difference is generated at the upper portion and lower portion of the electrolyte layer 33 by ion movement or the like in the electrode layers 34 and 35 and the electrolyte layer 33, bending stress is generated, and thus, a tip 37 which is a free end of the polymer actuator 2 can be bent and deformed in the height direction as shown by dotted lines. In general, it is considered that a principle, in which the swelling difference is generated between the electrodes by the ion movement, is not unambiguous. However, as one of the representative principle factors, it is known that the swelling difference is generated by a difference of an ion radius between a positive ion and a negative ion.

Moreover, preferably, the fixing support portion 38 shown in FIG. 2 is a connection portion which electrically connects the electrode layers 34 and 35. Alternatively, a wiring substrate or the like may be configured to be disposed between the fixing support portion 38 and each of the electrode layers 34 and 35.

As shown in FIGS. 1A to 1C, the polymer actuator 2 is disposed below the driven body 4.

A width T1 of the opening 3a provided in the case 3 is formed to be slightly larger than a diameter T2 of the driven body 4. In addition, protrusions 6 extending to be approximately parallel to an XY plane are formed in the middle in the height direction (thickness direction) of the driven body 4, and a width dimension between one protrusion 6 and the other protrusion 6 is T3 as shown by the cross-section of FIG. 1A. In addition, the width T1 of the opening 3a is formed to be smaller than the width dimension T3.

The opening 3a may be formed in a circular shape with the width T1 as the diameter, or may be formed in a shape other than the circular shape.

For example, the case 3 shown in FIGS. 1A to 1C is an upper case configuring the drive device 1. As shown in FIGS. 1A to 1C, a first conductive portion 7 is provided on a ceiling surface (detection surface) 3b which is positioned at the side portion of the opening 3a of the case 3. In the first conductive portion 7, a plurality of conductive patterns 7a and 7a are formed on both sides in the X direction with respect to the opening 3a.

The driven body 4 shown in FIGS. 1A to 1C is movably supported in the height direction (Z) by the polymer actuator 2, and for example, is a pin in a Braille device. In FIGS. 1A to 1C, one driven body 4 is shown. However, a plurality of driven bodies 4 may be provided.

The driven body 4 includes a main body portion 5 having a predetermined height dimension in the height direction (Z), and a protrusion 6 which extends in a direction of a surface parallel to the XY plane from the middle in the height direction (Z) of the main body portion 5. For example, as shown in FIG. 1C, the protrusion 6 is a flange portion which is disposed on the entire circumference around the main body portion 5. As shown in FIG. 1C, the plan shapes of the main body portion 5 and the protrusion 6 are a circular shape. However, the shapes are not particularly limited. In addition, the protrusion 6 may oppose the conductive patterns 7a and 7a provided on the ceiling surface 3b of the case 3 in the height direction (Z), and accordingly, in the embodiment of FIGS. 1A to 1C, the protrusion 6 may be configured so as to extend to only both sides in the X direction of the main body portion 5.

As shown in FIGS. 1A and 1B, a second conductive portion 8 is provided on the upper surface (the surface opposing the detection surface (ceiling surface)) of the protrusion 6 of the driven body 4. The second conductive portion 8 may be formed on the entire surface of the protrusion 6 shown in FIG. 1C, or the pattern may be formed on only the portion opposing the conductive patterns 7a and 7a in the height direction (Z).

In addition, as shown in FIGS. 1A and 1B, a wiring member (second member) 10 is provided on the inner side of the case 3 to be separated from the case 3 or to be integrated with the case 3. The wiring member 10 is disposed with a predetermined interval below (at the side opposite to the detection surface (ceiling surface) with respect to the upward drive direction) the case 3.

As shown in FIGS. 1A and 1B, the wiring member 10 is disposed below the protrusion 6 provided on the driven body 4. Also in the wiring member 10, an opening 10a is formed at a position opposing the case 3 in the height direction (Z). In FIGS. 1A and 1B, the width T4 of the opening 10a is approximately the same as the width T1 of the opening 3a formed on the case 3. However, the size relationship between the opening 10a and the opening 3a may be changed according to the shape or the like of the main body portion 5 of the driven body 4. Moreover, the opening 10a provided on the wiring member 10 is not necessarily required according to the structure of the driven body 4. For example, when the protrusion 6 provided on the driven body 4 is disposed on the lowermost end and the driven body 4 is lowered to the maximum as shown in FIG. 1A, if the protruding portion, which enters the inner portion of the opening 10a and protrudes in the down direction, is not present on the driven body 4, the opening 10a may not be provided.

As shown in FIGS. 1A and 1B, a third conductive portion 11 is formed on the upper surface of the wiring member 10. In the third conductive portion 11, a plurality of conductive patterns 11a and 11a are configured on both sides in the X direction with respect to the opening 10a.

As shown in FIGS. 1A and 1B, a fourth conductive portion 12 is provided on the lower surface of the protrusion 6 of the driven body 4. The fourth conductive portion 12 may be formed on the entire lower surface of the protrusion 6 shown in FIG. 1C, or the pattern may be formed on only the portion opposing the conductive patterns 11a and 11a in the height direction (Z).

FIG. 1A shows a state where the polymer actuator 2 positioned below the driven body 4 is separated from the driven body 4, and for example, the polymer actuator 2 shown in FIG. 1A is positioned at a reference state in which the polymer actuator is not bent and deformed in the height direction as shown by solid lines in FIG. 2.

Alternatively, in FIG. 1A, the polymer actuator 2 is bent and deformed downward and may be separated from the driven body 4 to the lower portion.

In addition, in the reference state where the polymer actuator 2 is not bent and deformed as shown in FIG. 2, the polymer actuator abuts the lower surface of the driven body 4. However, as shown in FIG. 1A, a positional relationship between the driven body 4 and the polymer actuator 2 can be adjusted so that the driven body 4 is lowered.

In FIG. 1A, the third conductive portion 11 provided on the wiring member 10 and the fourth conductive portion 12 provided on the protrusion 6 of the driven body 4 come into electrical contact with each other. In FIG. 1A, the third conductive portion 11 is configured of the plurality of conductive patterns 11a and 11a, and a plurality of contact portions are configured between the third conductive portion 11 and the fourth conductive portion 12.

As shown in FIG. 1A, in the state where the driven body 4 is not inclined and is appropriately lowered, the third conductive portion 11 and the fourth conductive portion 12 come into contact with each other by the plurality of contact portions, and thus, the lowered state of the driven body 4 can be detected. That is, when the driven body 4 is appropriately lowered for the first time after all of the plurality of conductive patterns 11a and 11a come into contact with the fourth conductive portion 12, the driven body is detected.

In FIG. 1B, the tip 37 of the polymer actuator 2 is bent and deformed upward as shown by the dotted lines of FIG. 2, the polymer actuator presses the driven body 4 upward to move the driven body 4, and an upper portion 4a of the driven body 4 protrudes further upward than the upper surface 3c of the case 3. At this time, as shown in FIG. 1B, the first conductive portion 7 provided on the ceiling surface 3b of the case 3 comes into electrical contact with the second conductive portion 8 provided on the upper surface of the protrusion 6 of the driven body 4. In FIG. 1B, the first conductive portion 7 is configured of the plurality of conductive patterns 7a and 7a, and a plurality of contact portions are configured between the first conductive portion 7 and the second conductive portion 8.

As shown in FIG. 1B, in the state where the driven body 4 is not inclined and is raised straight, the first conductive portion 7 and the second conductive portion 8 come into contact with each other by the plurality of contact portions, and thus, the raised state of the driven body 4 can be detected. That is, when the driven body 4 is appropriately raised for the first time after all of the plurality of conductive patterns 7a and 7a come into contact with the second conductive portion 8, the driven body is detected.

In this way, in the present embodiment, the driven body 4 is raised in a state where the driven body is inclined, or the like, and thus, when the first conductive portion 7 and the second conductive portion 8 do not come into contact with each other on the plurality of contact portions, the raised state of the driven body 4 is not detected. In this way, since the raised state of the driven body 4 is detected for the first time after the first conductive portion 7 and the second conductive portion 8 come into contact with each other by the plurality of contact portions, it is possible to securely detect that the driven body 4 is raised normally.

In the present embodiment, the configuration is essential, in which the first conductive portion 7 (conductive patterns 7a and 7a) formed on the ceiling surface 3b of the case 3 and the second conductive portion 8 formed on the upper surface of the protrusion 6 of the driven body 4 are provided and the raised state of the driven body 4 is detected by the plurality of contact portions, and the configurations of the third conductive portion 11 and the fourth conductive portion 12 detecting the lowered state of the driven body 4 may not be present. However, if the third conductive portion 11 and the fourth conductive portion 12 are provided and the lowered state of the driven body 4 can also be detected, it is possible to detect not only the normal raised state of the driven body 4 but also the normal lowered state of the driven body 4, which is suitable.

As shown in FIG. 3A, the first conductive portion 7 is formed to be divided in plural along the periphery of the opening 3a, and the second conductive portion 8 formed on the driven body 4 side is also matched to each conductive pattern 7a of the first conductive portion 7 and can be formed to be divided into the plurality of conductive patterns 8a.

In addition, FIG. 3B is a circuit diagram for detecting the raised state of the driven body 4, and as shown in FIG. 3B, a plurality of contact portions 15a to 15h are configured by pairs of respective conductive patterns 7a and 8a opposing each other in the height direction. In the circuit of FIG. 3B, if all contact portions 15a to 15h are not ON (if the conductive patterns 7a and 8a of the pair do not come into contact with each other), the raised state of the driven body 4 cannot be detected. Meanwhile, in FIG. 3C, each of the contact portions 15a to 15h configures an individual circuit. Alternatively, a configuration may be adopted in which the contact portions 15a to 15h are divided into a plurality of groups and the contact portions in each group come into contact with each other. In FIG. 3C, when the driven body 4 reaches the raised state for the first time after all eight contact portions 15a to 15h are ON, it is preferable that the raised state be detected. However, it is not necessary that all contact portions are in ON states. For example, when four or more contact portions among eight contact portions 15a to 15h are ON, it may be detected that the driven body 4 is raised normally. However, in order to detect the raised state of the driven body 4 even in the state in which all of the plurality of contact portions 15a to 15h are not ON, preferably, the raised state of the driven body 4 can be detected on the condition that one or more contact portions opposing each other at least with respect to the opening 3a are in ON states so that the raised state is not detected when the driven body 4 is raised in the state where the driven body is inclined.

Figure 4:
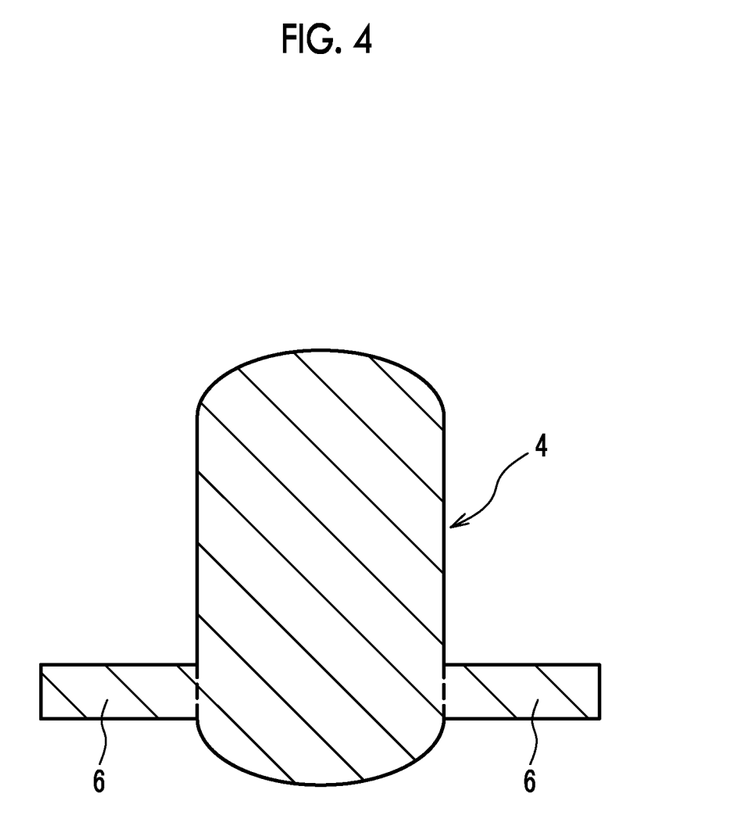
FIG. 4 is a vertical enlarged cross-sectional view of a driven body according to another embodiment.

In addition, in an embodiment shown in FIG. 4, the entire driven body 4 is formed of a conductive resin. The conductive resin may include a resin with which a metal filler is mixed, a carbon resin, or the like.

Moreover, only a portion of the protrusion 6 of the driven body 4 shown in FIG. 4 may be formed of a conductive resin. Accordingly, it is not necessary to form the second conductive portion 8 and the fourth conductive portion 12 separately on the front and rear surfaces of the protrusion 6, and thus, the driven body 4 can be simply formed.

Moreover, in the present embodiment, preferably, at least one of the first conductive portion 7 and the second conductive portion 8 is formed of an elastic conductive resin material. The elastic conductive resin material includes a configuration in which a conductive filler is mixed into a rubbery elastic resin. Accordingly, the first conductive portion 7 and the second conductive portion 8 can safely come into electric contact with each other. In addition, preferably, at least one of the third conductive portion 11 and the fourth conductive portion 12 is formed of an elastic conductive resin material. Accordingly, the third conductive portion 11 and the fourth conductive portion 12 can safely come into electric contact with each other.

Figure 5:
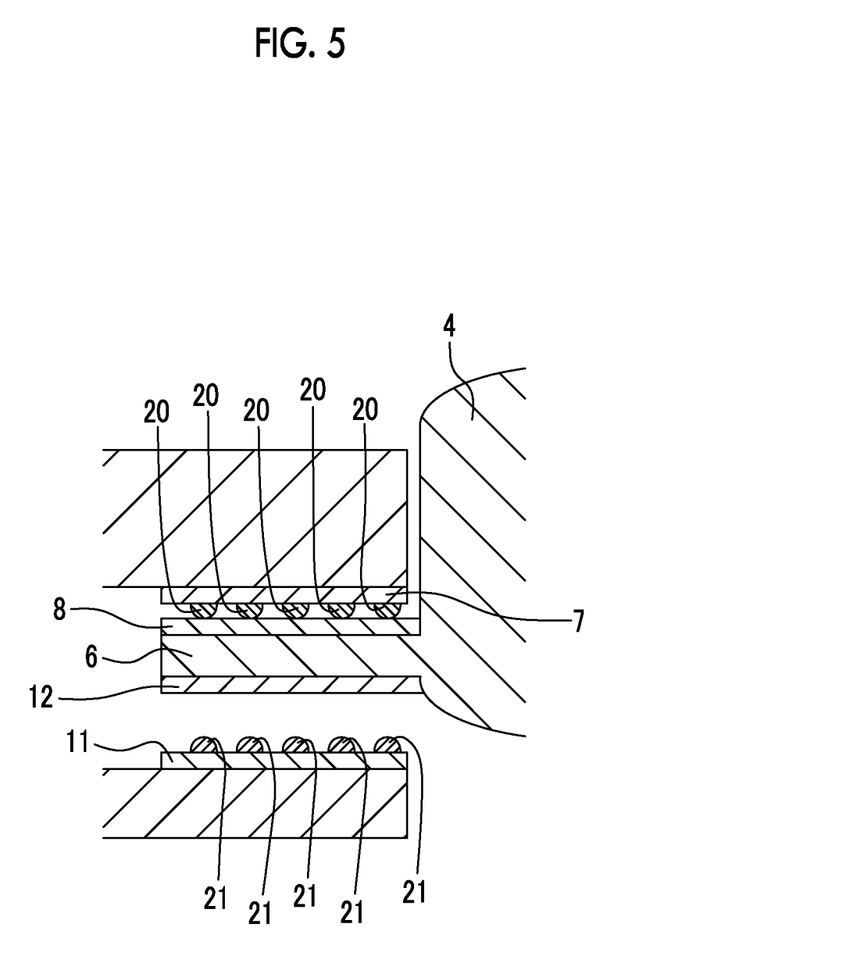
FIG. 5 is a vertical partial enlarged cross-sectional view of an input device according to another embodiment.

Moreover, in an embodiment shown in FIG. 5, a plurality of projections 20 are formed on the surface of the first conductive portion 7. Each of the projections 20 is a conductive portion which is integrally or separately formed with the first conductive portion 7. Accordingly, the first conductive portion 7 and the second conductive portion 8 can safely come into electric contact with each other. Moreover, the projections 20 may be provided on the second conductive portion 8 side or may be provided on both the first conductive portion 7 and the second conductive portion 8. In addition, in FIG. 5, a plurality of projections 21 are formed on the surface of the third conductive portion 11. Each of the projections 21 is a conductive portion which is formed integrally with or separately from the third conductive portion 11. Accordingly, the third conductive portion 11 and the fourth conductive portion 12 can safely come into electric contact with each other. Moreover, the projections 21 may be provided on the fourth conductive portion 12 side or may be provided on both the third conductive portion 11 and the fourth conductive portion 12.

Figure 6:
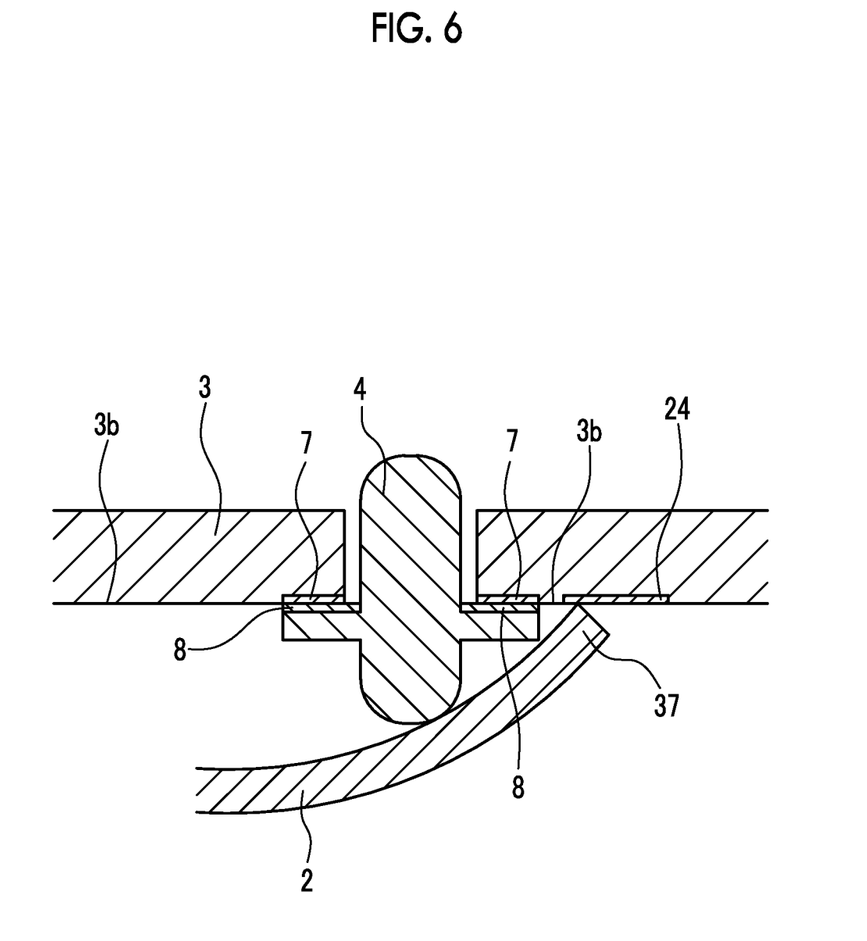
FIG. 6 is a vertical partial cross-sectional view of an input device according to another embodiment.

Moreover, in the present embodiment, as shown in FIG. 6, for example, a detection portion 24 for detecting whether or not the polymer actuator 2 is appropriately bent and deformed upward is provided on the ceiling surface 3b of the case 3, and thus, it is possible to detect that the tip 37 of the polymer actuator 2 comes into contact with the detection portion 24. In FIG. 6, the driven body 4 is raised when the polymer actuator 2 is bent and deformed upward, the raised state is detected by the contacts of the plurality of contact portions between the first conductive portion 7 and the second conductive portion 8, and the curved state of the polymer actuator 2 is also detected by the detection portion 24. The electric contact between the detection portion 24 and the polymer actuator 2 is detected at the detection portion 24. Accordingly, whether or not the polymer actuator 2 is driven normally can be detected.

In addition, the position of the detection portion 24 may not necessarily be the ceiling surface 3b of the case 3.

In addition, in the drive device of the present embodiment, any of the above-described embodiments may use the polymer actuator 2, and accordingly, a decrease in the thickness and reduction in power consumption of the drive device 1 can be promoted.

For example, the drive device 1 having the polymer actuator 2 of the present embodiment can be applied to a dot display device for Braille. However, the drive device can also be applied to other drive devices.

It should be understood by those skilled in the art that various modifications, combinations, sub-combinations and alterations may occur depending on design requirements and other factors insofar as they are within the scope of the appended claims of the equivalents thereof.

What is claimed is:

1. A drive device using a polymer actuator including a driven body provided in an opening of a first member, and a polymer actuator configured to be bent and deformed and to movably support the driven body in a predetermined drive direction, wherein a first conductive portion is provided on the first member side, a second conductive portion is provided on the driven body side, a plurality of contact portions are configured of the first conducive portion and the second conductive portion, the first conducive portion and the second conductive portion come into contact with each other on the plurality of contact portions when the driven body is moved by the polymer actuator, and a movement state of the driven body is detected.

2. The drive device using a polymer actuator according to claim 1, wherein at least one of the first conductive portion and the second conductive portion is divided into a plurality of conductive patterns, and configures the plurality of contact portions.

3. The drive device using a polymer actuator according to claim 1, wherein a second member is provided in an inner portion of the first member, a third conductive portion is provided on the second member side, a fourth conductive portion is provided on the driven body side, a plurality of contact portions are configured of the third conductive portion and the fourth conductive portion, the third conductive portion and the fourth conductive portion come into contact with each other on the plurality of contact portions when the driven body is returned, and the return state of the driven body is detected.

4. The drive device using a polymer actuator according to claim 3, wherein at least one of the third conductive portion and the fourth conductive portion is divided into a plurality of conductive patterns, and configures the plurality of contact portions.

5. The drive device using a polymer actuator according to claim 1, wherein a protrusion, which opposes a detection surface positioned on the side of the opening in the drive direction, is provided on the driven body, the first conductive portion is provided on the detection surface, and the second conductive portion is provided on a surface opposing the detection surface of the protrusion.

6. The drive device using a polymer actuator according to claim 5, wherein a second member opposing the protrusion is provided on a side opposite to the detection surface in the drive direction of the protrusion, a third conductive portion is provided on a surface opposing the protrusion of the second member, a fourth conductive portion is provided on a surface opposing the second member of the protrusion, the third conductive portion and the fourth conductive portion come into contact with each other on a plurality of contact portions when the driven body is returned, and a return state of the driven body is detected.

7. The drive device using a polymer actuator according to claim 5, wherein the entirety or a portion of the protrusion of the driven body is formed of a conductive resin.

8. The drive device using a polymer actuator according to claim 1, wherein at least a portion of the conductive portion provided to come into contact with or be separated from the contact portions by a movement in a predetermined drive direction of the driven body is formed of an elastic conductive resin material.

9. The drive device using a polymer actuator according to claim 1, wherein a plurality of projections are formed on at least one surface of the conductive portion provided to come into contact with or be separated from the contact portions by a movement in a predetermined drive direction of the driven body.

10. The drive device using a polymer actuator according to claim 1, wherein a deformation detection portion configured to detect bending and deformation of the polymer actuator is provided.

* * * * *